(12) United States Patent
Huh et al.

(10) Patent No.: US 7,601,467 B2
(45) Date of Patent: Oct. 13, 2009

(54) METHOD OF MANUFACTURING EUVL ALTERNATING PHASE-SHIFT MASK

(75) Inventors: Sung-min Huh, Yongin-si (KR);
Hee-bom Kim, Suwon-si (KR);
Seong-woon Choi, Suwon-si (KR);
Dong-wan Kim, Seongnam-si (KR);
Chan-uk Jeon, Seongnam-si (KR)

(73) Assignee: Samsung Electronics Co., Ltd.,
Suwon-si, Gyeonggi-do (KR)

( * ) Notice: Subject to any disclaimer, the term of this patent is extended or adjusted under 35 U.S.C. 154(b) by 557 days.

(21) Appl. No.: 11/367,438

(22) Filed: Mar. 6, 2006

(65) Prior Publication Data
US 2006/0240334 A1    Oct. 26, 2006

(30) Foreign Application Priority Data
Apr. 20, 2005    (KR)    .................. 10-2005-0032756

(51) Int. Cl.
*G03F 1/00*    (2006.01)
(52) U.S. Cl. .......................................... 430/5
(58) Field of Classification Search ................ 430/5
See application file for complete search history.

(56) References Cited

U.S. PATENT DOCUMENTS

| 5,807,650 | A  | * | 9/1998  | Komano et al. | 430/5 |
| 6,641,959 | B2 | * | 11/2003 | Yan | 430/5 |
| 6,645,679 | B1 | * | 11/2003 | La Fontaine et al. | 430/5 |
| 6,821,682 | B1 | * | 11/2004 | Stearns et al. | 430/5 |

FOREIGN PATENT DOCUMENTS

| KR | 1020020014072 | 2/2002 |
| KR | 1020020052468 | 4/2002 |
| KR | 100429860 | 4/2004 |

* cited by examiner

*Primary Examiner*—Mark F Huff
*Assistant Examiner*—Jonathan Jelsma
(74) *Attorney, Agent, or Firm*—Volentine & Whitt, PLLC

(57) ABSTRACT

A method of manufacturing an extreme ultra-violet lithography (EUVL) alternating phase-shift mask comprises preparing a substrate having a reflective layer, forming a light-shielding layer pattern on the reflective layer to cover part of the reflective layer while leaving a reflective region of the reflective layer exposed, forming a trench in a phase-shift region of the reflective layer by etching the reflective layer, and changing the physical structure of a non phase-shift region of the reflective region to lower its reflectivity with respect to extreme ultra-violet (EUV) light.

18 Claims, 3 Drawing Sheets

METHOD OF MANUFACTURING EUVL ALTERNATING PHASE-SHIFT MASK

BACKGROUND OF THE INVENTION

1. Field of the Invention

Embodiments of the present invention relate generally to methods of manufacturing an alternating phase-shift mask used for fabricating semiconductor devices. More specifically, embodiments of the invention relate to methods of manufacturing an extreme ultra-violet lithography (EUVL) alternating phase-shift mask.

A claim of priority is made to Korean Patent Application No. 2005-0032756, filed on Apr. 20, 2005, the disclosure of which is hereby incorporated by reference in its entirety.

2. Description of Related Art

Photolithography processes are commonly used to form minute patterns in electronic devices such as integrated circuits. In general, the minimum size of a pattern that can be formed by a photolithography process is limited by the resolution of photolithography equipment used to carry out the process. Where the desired critical dimension of a pattern approaches the resolution of the photolithography equipment, a proximity effect may occur. Briefly, the proximity effect includes undesirable structural interactions between adjacent features formed by the pattern. In the case of photolithography processes, the proximity effect generally results from electron scattering in an irradiated resist layer where the pattern is formed.

One proposed method for addressing the proximity effect in photolithography processes using a light source such as a krypton fluoride (KrF) or argon fluoride (ArF) laser is to shift the light source's phase using a transmitting phase-shift mask. Shifting the light source's phase introduces destructive interference which can prevent some of the electron scattering. One way to form the transmitting phase-shift mask is by etching a phase-shift region in a quartz substrate so that the quartz substrate will reflect the light source with respective phases of 0° and 180°.

One shortcoming of the above method is that light passing through the phase-shift region can be scattered, for example, by the sidewalls of the etched region. As a result, the intensity of light passing through the phase-shift region may be lower than the intensity of light passing through other portions of the quartz substrate. Due to this light intensity difference, a critical dimension (CD) difference (ΔCD) may arise between adjacent patterns transferred on a wafer. In addition, when the phase-shift deviates from 180°, a ΔCD reversal, which is also called an X-phenomenon, may occur. To address the X-phenomenon, an undercut is generally formed in the etched phase-shift region using an isotropic wet etching process to prevent light loss from occurring.

However, in next-generation EUVL exposure technology, because the absorbency of EUV light sources having a short wavelength is too high when transmitting masks are used, reflective masks are used instead of transmitting masks. To maximize the reflectivity of EUV with a wavelength of 13.5 nm, a reflective mask includes a reflective layer including two types of material alternately stacked a plurality of times. For example the reflective layer could comprise 40 pairs of alternately stacked molybdenum (Mo) and silicon (Si) layers with a chromium (Cr) shielding layer pattern formed thereon. Similar to the transmitting masks, the intensity of light reflected by a phase-shifting region of a reflecting phase-shift mask is generally lower than the intensity of light reflected by other portions of the reflecting phase-shift mask. Accordingly, the reflecting phase-shift mask also suffers from the ΔCD problem. Unfortunately, however, the ΔCD cannot be addressed by the same method used to reduce ΔCD in transmitting phase-shift masks.

Several methods have been proposed for reducing the ΔCD or X-phenomenon created by EUVL alternating phase-shift masks. Some of these methods are disclosed, for example, in the following two documents: "EUVL Alternating Phase-shift Mask Imaging Evaluation", Pei-Yang Yan et al., Proc. Of SPIE Vol. 4889; and, "Phase-shift Mask in EUV Lithography", Minoru Sugawara et al., SPIE Vol. 5037.

Unfortunately, all of the proposed methods are difficult and complicated to implement and therefore highly impractical.

SUMMARY OF THE INVENTION

Embodiments of the present invention recognize the general need to prevent a ΔCD or X-phenomenon from occurring in EUVL alternating phase-shift masks. Accordingly, embodiments of the invention provide various methods of forming EUVL alternating phase-shift masks so that the reflectivity of a non phase-shift region is lowered to be the same as the reflectivity of a phase-shift region.

According to one embodiment of the invention, a method of manufacturing an extreme ultra-violet lithography (EUVL) alternating phase-shift mask comprises preparing a substrate having a reflective layer. The reflective layer comprises a plurality of layers formed of a first material, alternately stacked with a plurality of layers formed of a second material. The method further comprises forming a light-shielding layer pattern on the reflective layer to cover part of the reflective layer while leaving a reflective region of the reflective layer exposed, forming a trench in a phase-shift region within the reflective layer by etching the reflective layer, and changing the physical structure of a non phase-shift region within the reflective region to lower a reflectivity of the non phase-shift region with respect to extreme ultra-violet (EUV) light.

According to another embodiment of the invention, a method of manufacturing an extreme ultra-violet lithography (EUVL) alternating phase-shift mask comprises preparing a substrate having a reflective layer, forming a light-shielding layer pattern to cover part of the reflective layer while leaving a reflective region of the reflective layer exposed, forming a 180° phase-shift region by etching a first portion of the reflective region, and changing the physical structure of a second portion of the reflective region such that the second portion of the reflective region reflects extreme ultra-violet (EUV) light with the same intensity as the first portion.

BRIEF DESCRIPTION OF THE DRAWINGS

The invention is described below in relation to several embodiments illustrated in the accompanying drawings. Throughout the drawings like reference numbers indicate like exemplary elements, components, or steps. In the drawings.

DESCRIPTION OF EXEMPLARY EMBODIMENTS

FIGS. 1A through 1H are sectional views illustrating exemplary method steps used to manufacture an EUVL alternating phase-shift mask according to several embodiments of the present invention.

Figure 1A:
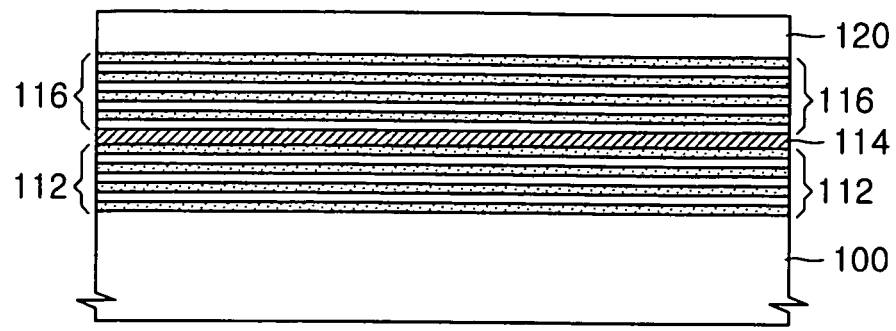
FIGS. 1A through 1H are sectional views illustrating exemplary method steps for manufacturing an EUVL alternating phase-shift mask according to several embodiments of the present invention.

Referring to FIG. 1A, reflective layers 112 and 116 are formed on a substrate 100. Reflective layers 112 and 116 both have a multi-layered structure in which molybdenum and silicon (Mo/Si) or molybdenum and beryllium (Mo/Be) are alternately stacked a plurality of times. Preferably, each of the alternating layers is stacked 40 times in each of reflective layers 112 and 116.

Typically, an etch stop layer 114 is formed between first and second reflective layer 112 and 116. In some embodiments of the invention, however, etch stop layer 114 is omitted. First and second reflective layers 112 and 116 are preferably formed with the same materials and structure.

A light-shielding layer 120 is formed over reflective layers 112 and 116. Light-shielding layer 120 is typically formed of tantalum nitride (TaN) or chromium (Cr).

Figure 1B:
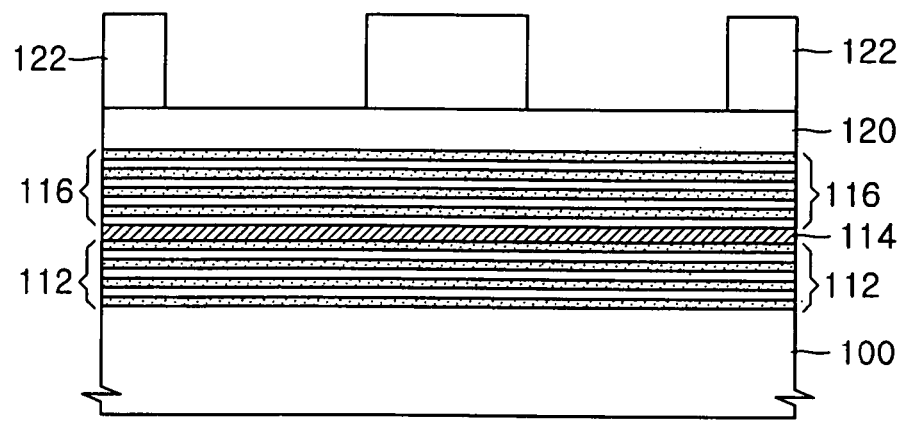

Referring to FIG. 1B, a first photoresist layer (not shown) is formed on light shielding layer 120. The first photoresist layer is then patterned to form a first photoresist pattern 122 exposing a part of light-shielding layer 120.

Figure 1C:
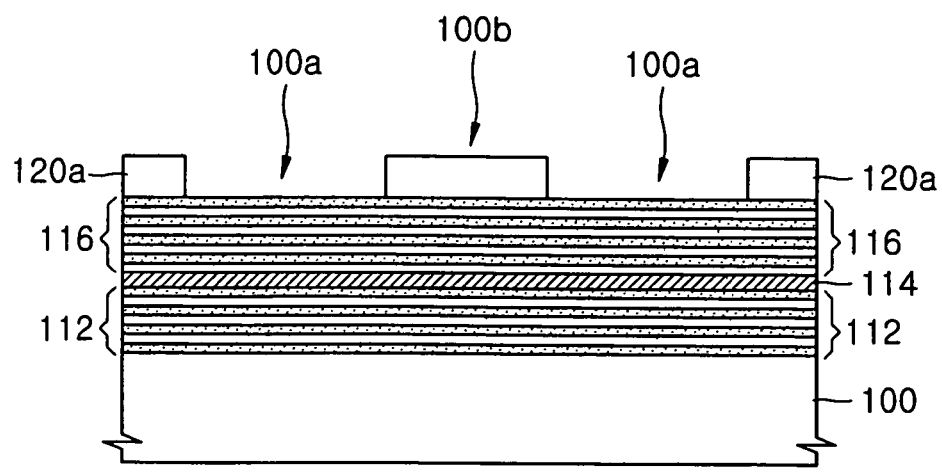

Referring to FIG. 1C, light-shielding layer 120 is anisotropically dry etched using first photoresist pattern 122 as an etch-mask to form a light-shielding layer pattern 120a exposing a reflective region 100a on reflective layer 116. Then, first photoresist pattern 122 is removed to expose a non-reflective region 100b on top of reflective layer 116.

Figure 1D:
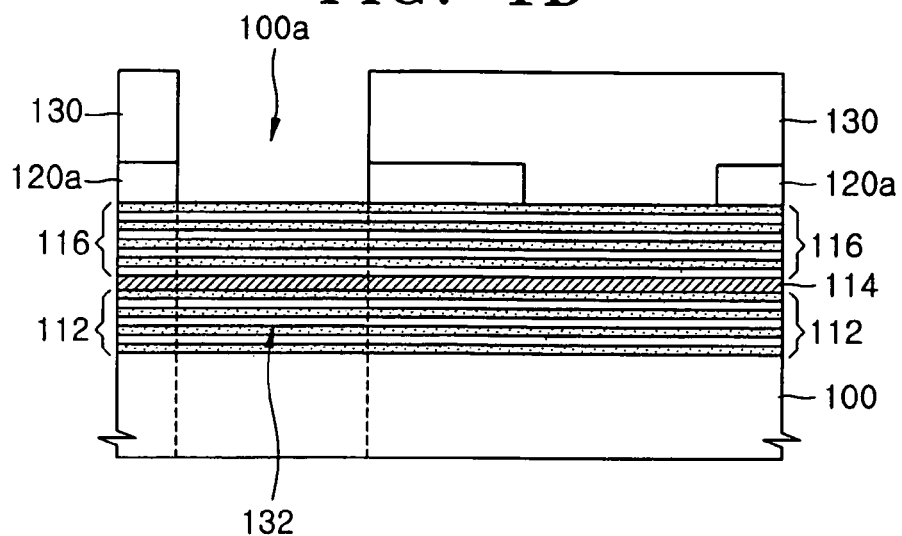

Referring to FIG. 1D, a second photoresist layer (not shown) is formed on substrate 100 over light-shielding layer 120. The second photoresist layer is patterned to form a second photoresist pattern 130 exposing a phase-shift region 132 in reflective region 100a of second reflective layer 116.

Figure 1E:
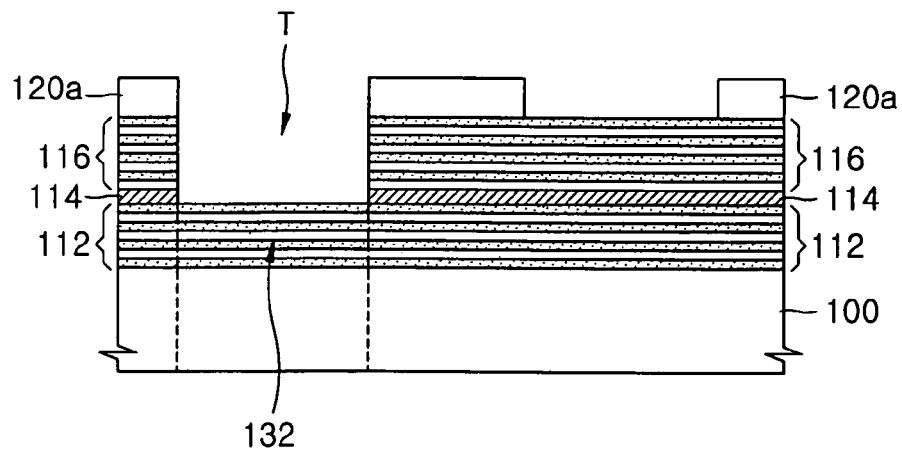

Referring to FIG. 1E, second reflective layer 116 is anisotropically-dry etched using photoresist pattern 130 as an etch-mask to form a trench (T) in second reflective layer 116. Then, second photoresist pattern 130 is removed. Etch-stop layer 114 can be used as an etching endpoint when forming trench (T).

Trench (T) causes a 180° phase-shift to occur in light reflecting off of phase-shift region 132.

Figure 1F:
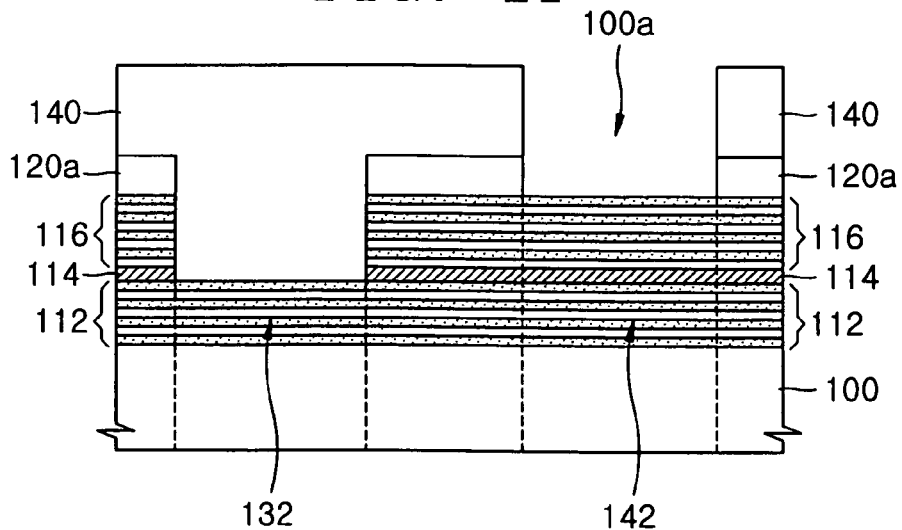

Referring to FIG. 1F, a third photoresist layer (not shown) is formed on substrate 100 over second photoresist pattern 130. The third photoresist layer is patterned to expose a non phase-shift region 142 in reflective region 100a of second reflective layer 116.

Figure 1G:
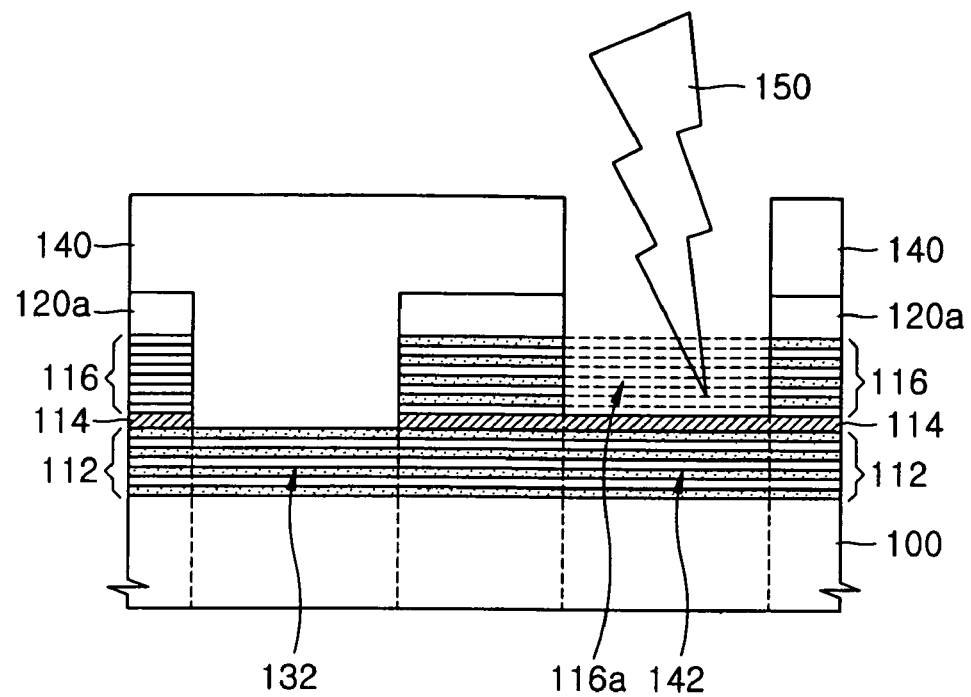

Referring to FIG. 1G, a physical shock 150 is selectively applied to exposed non phase-shift region 142 using third photoresist pattern 140 as an etch mask. As a result of the physical shock, the structure of a portion of second reflective layer 116 defined by non phase-shift region 142 undergoes a physical transformation to form a low-reflectivity region 116a.

One way to apply physical shock 150 to second reflective layer 116 is to use a heat treating method in which a localized focused electron beam (e-beam) is illuminated on non phase-shift region 142. Preferably, the localized focused e-beam has a diameter between several μm and multiple hundreds of μm, an exposure time in the tens of milliseconds, a current about 5-50 nA, and an energy of about 10 KeV.

By illuminating the focused e-beam on non phase-shift region 142 of second reflective layer 116, the illuminated region of second reflective layer 116 is thermally damaged, which causes its reflectivity to decrease. By selectively lowering the reflectivity of the non phase-shift region of second reflective layer 116, the intensity of light reflected by non phase-shift region 142 can be lowered to the intensity level of light reflected by phase-shift region 132.

Another way to apply physical shock 150 to reflective layer 116 is to illuminate a FIB on non phase-shift region 142 of second reflective layer 116. By illuminating the FIB on non phase-shift region 142, the surface of the illuminated region is slightly etched to form a small recess; The small recess causes the reflectivity of non phase-shift region 142 to decrease such that the intensity of light reflected by non phase-shift region 142 is the same as the intensity of light reflected by phase-shift region 132.

Yet another way to apply physical shock 150 to reflective layer 116 is to use an ion-sputtering method. Preferably, the ion-sputtering method uses a gas for which the etching selection ratio between reflective layer 116 and third photoresist pattern 140 is about 5:1 or more. For example, the gas used for the ion-sputtering method may be argon gas. Preferably, the ion-sputtering method does not cause any damage to reflective region 100a exposed in non phase-shift region 142.

Typically, the ion-sputtering method is performed by a sputtering apparatus having a source/bias power of tens or hundreds of watts. The bias power is preferably set higher than the source power to perform a bias sputtering. In one embodiment of the invention, the ion-sputtering method exposes non phase-shift region 142 of the second reflective layer 116 to Ar plasma for a period of several seconds to several tens of seconds under a pressure of several mTorrs to several tens of mTorrs. Throughout the ion-sputtering process, the sputtering temperature is preferably maintained constant to prevent diffusion of multi-layered reflective layers 112 and 116.

When Ar ion-sputtering is applied to non phase-shift region 142 of second reflective layer 116, a physical shock from the sputtering causes a physical change in non phase-shift region 142 of second reflective layer 116, thereby lowering its reflectivity. By selectively lowering the reflectivity of second reflective layer 116 in non phase-shift region 142 using the ion-sputtering method, the intensity of EUV light illuminated on second reflective layer 116 can be selectively lowered such that the EUV light reflected from second reflective layer 116 in phase-shift region 132 and non phase-shift region 142 is substantially the same.

Figure 1H:
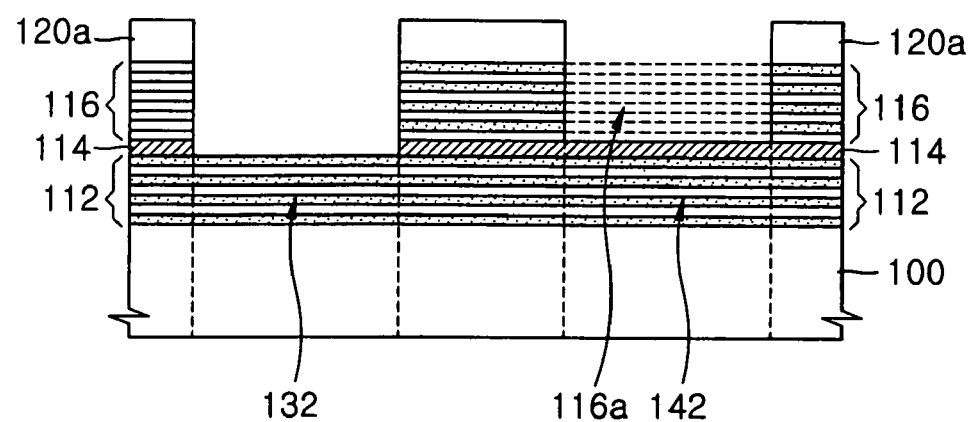

Referring to FIG. 1H, third photoresist pattern 140 is removed to complete an EUVL alternating phase-shift mask.

According to selected embodiments of the present invention described above, methods of manufacturing an EUVL alternating phase-shift mask include physically changing the structure of a portion of a reflective layer in a non phase-shift region to lower the intensity of EUV light reflected thereon. The physical change can be brought about by several different techniques, such as those involving a focused e-beam, a FIB, or Ar sputtering. By physically changing the reflective layer in the non phase change region, the intensity of reflected EUV light in the non phase change region can be lowered to the intensity of reflected EUV light in a phase-shift region of the reflective layer. As a result, a ACD or X-phenomenon can be prevented from occurring between adjacent patterns printed on a wafer. In addition, unevenness of an aerial image can be relieved over the entire region of the phase-shift region and the non phase-shift region of an EUVL alternating phase-shift mask.

The foregoing preferred embodiments are teaching examples. Those of ordinary skill in the art will understand that various changes in form and details may be made to the exemplary embodiments without departing from the scope of the present invention as defined by the following claims.

What is claimed is:

1. A method of manufacturing an extreme ultra-violet lithography (EUVL) alternating phase-shift mask, the method comprising:

preparing a substrate having a reflective layer including a plurality of layers formed of a first material, alternately stacked with a plurality of layers formed of a second material;

forming a light-shielding layer pattern on the reflective layer to cover part of the reflective layer while leaving a reflective region of the reflective layer exposed;

forming a trench in a phase-shift region within the reflective region by etching the reflective layer;

forming a photoresist pattern on the light-shielding layer pattern and on the phase-shift region within the reflective layer to cover the light-shielding layer pattern and the phase-shift region while leaving a non phase-shift region within the reflective region exposed; and changing the physical structure of the non phase-shift region within the reflective region by applying a physical shock to the non phase-shift region using the photoresist pattern as a mask to lower a reflectivity of the non phase-shift region with respect to extreme ultra-violet (EUV) light.

2. The method of claim 1, wherein changing the physical structure of the non phase-shift region comprises:
illuminating a focused electron beam (e-beam) on the non phase-shift region.

3. The method of claim 1, wherein changing the physical structure of the non phase-shift region comprises:
illuminating a focused ion beam (FIB) on the non phase-shift region.

4. The method of claim 1, wherein changing the physical structure of the non phase-shift region comprises:
performing an argon ion-sputtering process on the non phase-shift region.

5. The method of claim 1, wherein the first material comprises molybdenum (Mo) and the second material comprises Silicon (Si) or Beryllium (Be).

6. The method of claim 1, wherein the reflective layer comprises a lower reflective layer and an upper reflective layer formed above the lower reflective layer;
wherein the upper and lower reflective layers are separated from each other by an etch-stop layer.

7. The method of claim 6, wherein forming the trench in the phase-shift region comprises:
etching the reflective region using the etch-stop layer for an etching endpoint.

8. The method of claim 1, wherein the light-shielding layer pattern comprises tantalum nitride (TaN) or chromium (Cr).

9. The method of claim 1, wherein forming the light-shielding layer pattern comprises:
forming a light-shielding layer on the reflective layer;
forming a photoresist pattern on the light-shielding layer; and,
etching the light-shielding layer using the photoresist pattern as an etch-mask.

10. The method of claim 1, wherein forming the trench in the phase-shift region comprises:
forming a photoresist pattern on the substrate over the light-shielding layer pattern; and,
anisotropy-dry etching the reflective layer using the second photoresist pattern as an etch-mask.

11. A method of manufacturing an extreme ultra-violet lithography (EUVL) alternating phase-shift mask, the method comprising:
preparing a substrate having a reflective layer;
forming a light-shielding layer pattern to cover part of the reflective layer while leaving a reflective region of the reflective layer exposed;
forming a 180° phase-shift region by etching a first portion of the reflective region;
forming a photoresist pattern on the light-shielding layer pattern and on the 180° phase-shift region to cover the light-shielding layer pattern and the 180° phase-shift region while leaving a second portion of the reflective region exposed; and
changing the physical structure of the second portion of the reflective region by applying a physical shock to the second portion of the reflective region using the photoresist pattern as a mask such that the second portion of the reflective region reflects extreme ultra-violet (EUV) light with the same intensity as the first portion.

12. The method of claim 11, wherein changing the physical structure of the second portion of the reflective region comprises:
illuminating a focused electron beam (e-beam) on the second portion of the reflective region.

13. The method of claim 11, wherein changing the physical structure of the second portion of the reflective region comprises:
illuminating a focused ion beam (FIB) on the second portion of the reflective region.

14. The method of claim 11, wherein changing the physical structure of the second portion of the reflective region comprises:
performing an argon ion-sputtering process on the second portion of the reflective region.

15. The method of claim 11, wherein the reflective layer comprises:
a plurality of layers formed of molybdenum (Mo), alternately stacked with a plurality of layers formed of silicon (Si) or Beryllium (Be).

16. The method of claim 11, wherein the reflective layer comprises:
a lower reflective layer including a plurality of layers formed of a first material, alternately stacked with a plurality of layers formed of a second material;
an upper reflective layer formed above the lower reflective layer and including a plurality of layers formed of the first material, alternately stacked with a plurality of layers formed of the second material; and,
and an etch-stop layer formed between the lower and upper reflective layers.

17. The method of claim 16, wherein forming the 180° phase-shift region comprises:
etching the upper reflective layer using the etch-stop layer for an etching endpoint.

18. The method of claim 11, wherein the light-shielding layer pattern comprises tantalum nitride (TaN) or chromium (Cr).

* * * * *